(12) United States Patent
Kwon et al.

(10) Patent No.: US 10,643,537 B2
(45) Date of Patent: May 5, 2020

(54) ORGANIC LIGHT-EMITTING DISPLAY DEVICE

(71) Applicant: LG Display Co., Ltd., Seoul (KR)

(72) Inventors: Yong-Chul Kwon, Seoul (KR); Jang-Hwan Kim, Paju-si (KR); Dong-Won Park, Goyang-si (KR); Jong-Min Park, Anyang-si (KR); Joon-Hee Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 128 days.

(21) Appl. No.: 15/815,687

(22) Filed: Nov. 16, 2017

(65) Prior Publication Data
US 2018/0190196 A1 Jul. 5, 2018

(30) Foreign Application Priority Data
Dec. 30, 2016 (KR) .................. 10-2016-0184210

(51) Int. Cl.
*G09G 3/3241* (2016.01)
*H01L 27/32* (2006.01)
*G09G 3/3233* (2016.01)

(52) U.S. Cl.
CPC ......... *G09G 3/3241* (2013.01); *G09G 3/3233* (2013.01); *H01L 27/3206* (2013.01); *H01L 27/3211* (2013.01); *G09G 2300/0819* (2013.01); *G09G 2300/0842* (2013.01); *G09G 2310/0251* (2013.01); *G09G 2310/0262* (2013.01); *G09G 2310/0283* (2013.01); *G09G 2310/08* (2013.01); *G09G 2320/0295* (2013.01); *G09G 2320/043* (2013.01); *H01L 27/3244* (2013.01)

(58) Field of Classification Search
CPC ......... G09G 3/3241; G09G 2300/0819; G09G 3/0842; G09G 2310/0251; G09G 2310/0262; G09G 2310/0283; G09G 2320/0295; G09G 2310/043; G09G 3/3233; G09G 2310/08; H01L 27/3206; H01L 27/3211; H01L 27/3244
USPC .......................................... 345/211
See application file for complete search history.

(56) References Cited

U.S. PATENT DOCUMENTS

| | | | |
|---|---|---|---|
| 2008/0074362 A1* | 3/2008 | Ogura .................. | G09G 3/3275 345/77 |
| 2011/0157152 A1* | 6/2011 | Byun ................... | G09G 3/3233 345/214 |
| 2013/0050292 A1* | 2/2013 | Mizukoshi ........... | G09G 3/3291 345/690 |
| 2014/0132589 A1* | 5/2014 | Min ...................... | G09G 3/3233 345/212 |
| 2017/0162120 A1* | 6/2017 | Hung ................... | G09G 3/3233 |

* cited by examiner

*Primary Examiner* — Mark Edwards
(74) *Attorney, Agent, or Firm* — Fenwick & West LLP

(57) ABSTRACT

An OLED display device capable of preventing luminance deviation caused by a voltage drop of an EVDD is disclosed. The OLED display device generates a reference voltage, a voltage level of which varies with distance from the data driver and supplies the reference voltage to the display panel through the data driver.

20 Claims, 8 Drawing Sheets

ORGANIC LIGHT-EMITTING DISPLAY DEVICE

CROSS-REFERENCE TO RELATED APPLICATIONS

This application claims the benefit of Republic of Korea Patent Application No. 10-2016-0184210, filed on Dec. 30, 2016, which is hereby incorporated by reference in its entirety.

BACKGROUND OF THE INVENTION

Field of the Invention

The present invention relates to an organic light-emitting diode display device for preventing luminance deviation caused by a voltage drop.

Discussion of the Related Art

A representative flat panel display device for displaying images using digital data includes a liquid crystal display (LCD) using liquid crystal, an organic light-emitting diode (OLED) display device using OLEDs, and an electrophoretic display (EPD) using electrophoretic particles.

Thereamong, the OLED display device is a self-luminescent device which causes an organic light-emitting layer to emit light through recombination of electrons and holes and is expected as a next-generation display device thanks to high luminance, low driving voltage, and ultra-thin film thickness.

Each of a plurality of pixels constituting the OLED display device includes an OLED element and a pixel circuit for driving the OLED element. In the pixel circuit, a storage capacitor connected between a gate electrode and a source electrode of a driving thin film transistor (TFT) charges a difference between a data voltage supplied from a data line through a first switching TFT and a reference voltage supplied from a reference line through a second switching TFT as a driving voltage. The driving TFT controls a driving current flowing into the OLED element from a high-potential power voltage (EVDD) line according to the charged driving voltage and the OLED element generates light proportional to the driving current.

However, in the OLED display device, since a voltage drop (IR drop) of an EVDD occurs due to wiring resistance and current of the EVDD line, the IR drop increases and thus the EVDD applied through the EVDD line decreases as a distance between an EVDD inlet and a pixel increases. Then, during a scan period (addressing period) for charging a driving voltage Vgs corresponding to a data voltage in a capacitor of each pixel, current (Ids) deviation of driving TFTs occurs due to the IR drop of the EVDD according to a vertical location of the pixel, thereby locally generating luminance deviation.

If the wiring width of the EVDD line increases in order to reduce a voltage drop of the EVDD, power consumption increases and a light-emitting area of an OLED element is reduced in correspondence to increase in the wiring width of the EVDD line. Therefore, degradation speed increases and thus lifetime is reduced.

SUMMARY OF THE INVENTION

Accordingly, the present invention is directed to an OLED display device that substantially obviates one or more problems due to limitations and disadvantages of the related art.

An object of the present invention is to provide an OLED display device capable of preventing luminance deviation caused by a voltage drop of an EVDD.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an OLED display device includes a display panel, a power line, a data driver, and a reference voltage adjuster. The display panel includes pixels configured to charge a capacitor with a driving voltage representing a difference between a data voltage supplied to a driving thin-film transistor (TFT) from a data line and a reference voltage supplied to the driving TFT from a reference line to cause an OLED element to emit light. The power line is configured to supply a high-potential power voltage to a driving TFT of each of the pixels. The data driver supplies the data voltage, the reference voltage, and the high-potential power voltage to the display panel. The reference voltage adjuster generates the reference voltage to have a voltage level that varies while the reference voltage is supplied to driving TFTs at different distances from the data driver. For example, the voltage level may vary of pixels starting from a pixel nearest to the data driver to a pixel farthest from the data driver in the display panel. The reference voltage adjuster supplies the reference voltage to the data driver for supplying to the display panel.

The OLED display device may further includes a timing controller configured to analyze an input image to calculate a total current predication value, and a sensing unit configured to sense the high-potential power voltage fed back through the data driver from the display panel to generate a sensing value. The timing controller may control the reference voltage adjuster to vary the voltage level of the reference voltage based on at least one of the total current predication value and the sensing value of the high-potential power voltage. The timing controller may control the reference voltage adjuster to generate the reference voltage to vary between a minimum value and a maximum value according to a slope of the reference voltage.

The timing controller may control the reference voltage adjuster to decrease the minimum value of the reference voltage and increase the slope of the reference voltage, as the total current prediction value of the image increases. In another embodiment, the timing controller may control the reference voltage adjuster to decrease the minimum value of the reference voltage and increase the slope of the reference voltage as the sensing value of the high-potential power voltage decreases.

The timing controller may furthermore control the reference voltage adjuster to decrease the reference voltage when driving pixels with increasing distance to the data driver.

The timing controller may control the reference voltage adjuster to decrease the reference voltage when driving pixels with decreased high-power power voltage.

The timing controller may control the reference voltage adjuster to increase the reference voltage over a frame period as pixel rows are sequentially scanned starting from a pixel row farthest from the data driver to a pixel row nearest to the data driver in the display panel.

The timing controller may control the reference voltage adjuster to decrease the reference voltage over a frame period as pixel rows are sequentially scanned starting from a pixel row nearest to the data driver to a pixel row farthest from the data driver in the display panel.

The display panel may be segmented into a plurality of regions in a scan direction and the timing controller may control the reference voltage adjuster to adjust the reference voltage to adjust the reference voltage stepwise in between scanning each of the plurality of regions.

In another embodiment, an organic light-emitting diode (OLED) display device comprises a display panel, a high-potential power source, and a reference voltage adjuster. The display panel comprises a plurality of pixels arranged in pixel rows, a plurality of data lines to provide respective data voltages to the plurality of pixel rows, a plurality of reference lines to provide respective reference voltages to the plurality of pixel rows, and a power line to distribute a high-potential power voltage to power each of the plurality of pixels. The plurality of pixels cause respective OLED elements to emit light based on differences between the respective data voltages and the respective reference voltage. A high-potential power source provides the high-potential power voltage to the power line. The reference voltage adjuster is configured to generate the respective reference voltages for each of the plurality of pixel rows. The respective reference voltages for the pixel rows vary with distance from the high-potential power source.

In an embodiment, the reference voltage adjuster generates the respective reference voltages for the plurality of pixel rows to increase with decreasing distance from the high-potential power source.

In an embodiment, the reference voltage adjuster generates the respective reference voltages for the plurality of pixel rows to vary non-linearly between a minimum reference voltage applied to a reference line of a pixel row farthest from the high-potential power source and a maximum reference voltage applied to a reference line for a pixel row closest to the high-potential power source.

In an embodiment, the reference voltage adjuster generates the respective reference voltages for the plurality of pixel rows to vary linearly between a minimum reference voltage applied to a reference line of a pixel row farthest from the high-potential power source and a maximum reference voltage applied to a reference line for a pixel row closest to the high-potential power source.

In an embodiment, the reference voltage adjuster generates the respective reference voltages for the plurality of pixel rows to vary step-wise in different sub-sections of the display panel between a minimum reference voltage applied to a reference line of a pixel row farthest from the high-potential power source and a maximum reference voltage applied to a reference line for a pixel row closest to the high-potential power source.

In an embodiment, for a given pixel row, the reference voltage adjuster generates a corresponding reference voltage based a sensed voltage sensing the high potential power voltage while driving the given pixel row.

In an embodiment, for a given pixel row, the reference voltage adjuster generates a corresponding reference voltage based on a predicted total current dissipated when driving the given pixel row.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Figure 1:
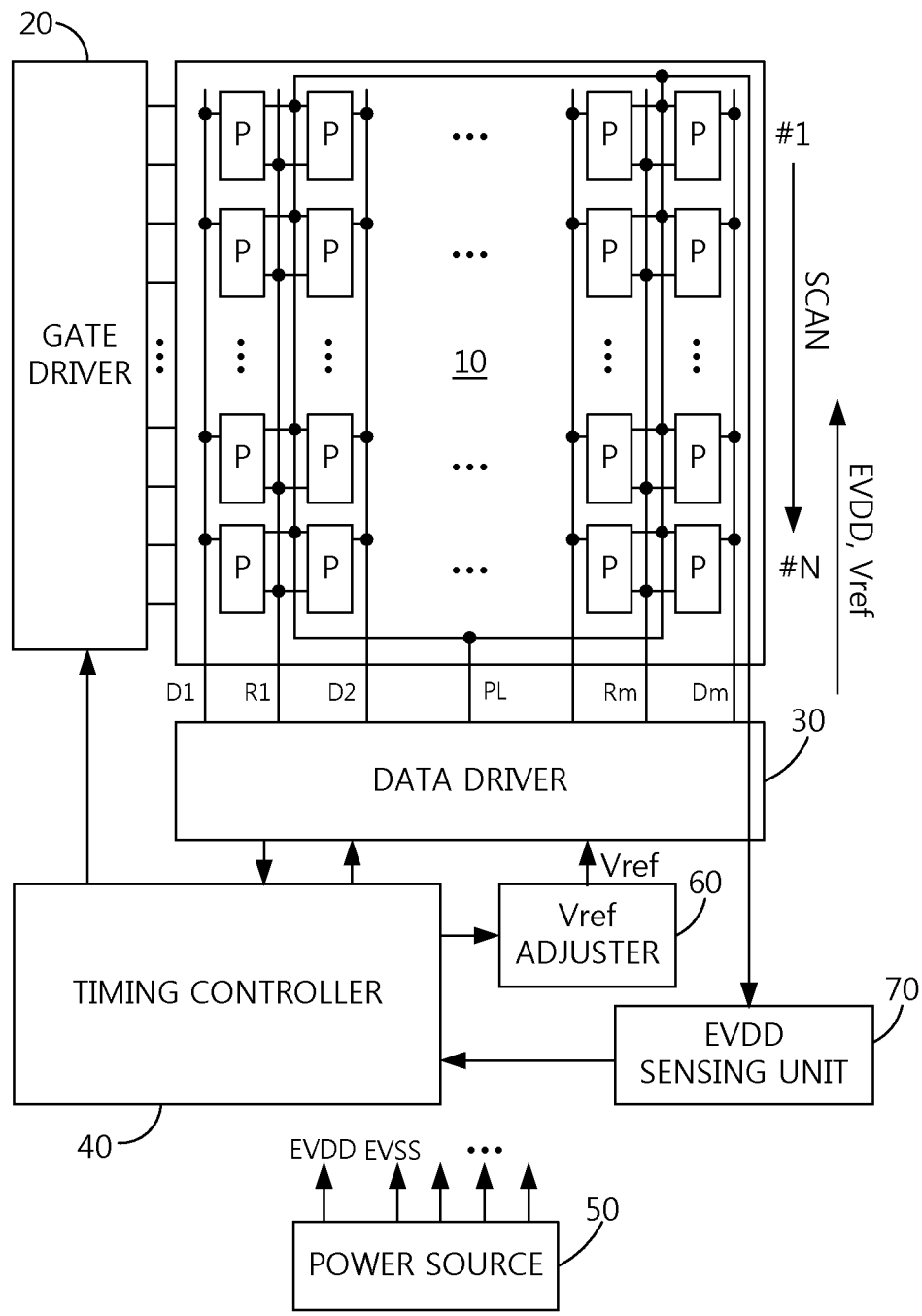
FIG. 1 is a block diagram of an OLED display device according to an embodiment of the present invention.
Figure 2:
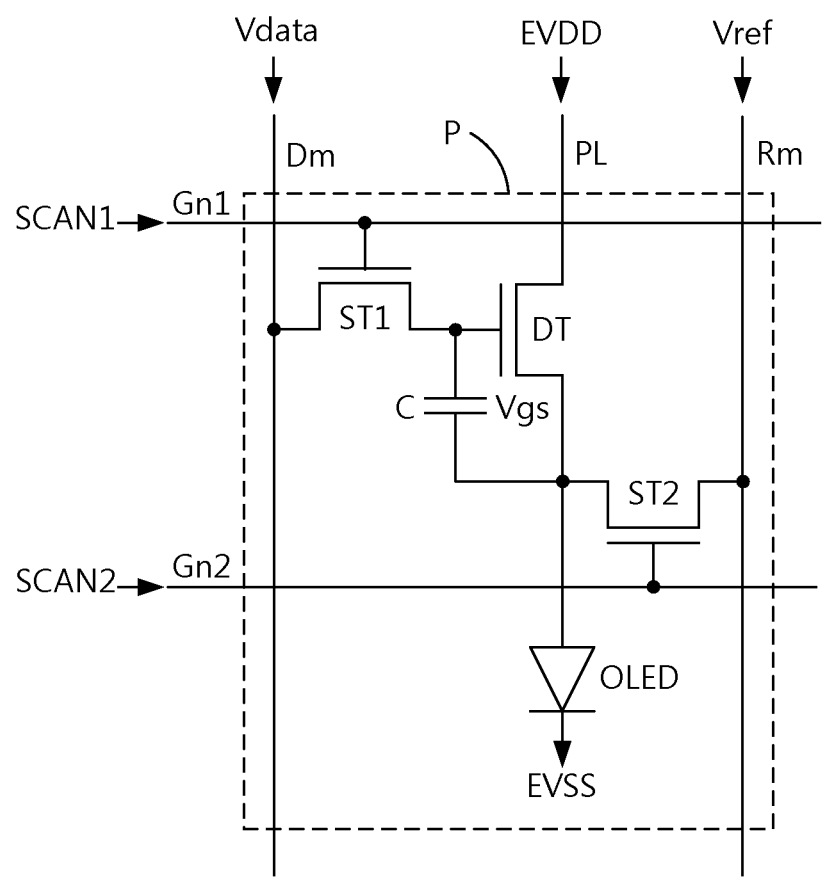
FIG. 2 is an equivalent circuit diagram illustrating the configuration of any one pixel shown in FIG. 1.

FIG. 1 is a block diagram schematically illustrating the configuration of an OLED display device according to an embodiment of the present invention and FIG. 2 is an equivalent circuit diagram illustrating the configuration of any one pixel applied to a display panel shown in FIG. 1.

Referring to FIG. 1, the OLED display device according to an embodiment includes a timing controller 40, a data driver 30, a gate driver 20, a display panel 10, and a power source 50.

The display panel 10 displays images through a pixel array having pixels P arranged in the form of a matrix (e.g., a plurality of pixel rows). A basic pixel may be configured by at least three subpixels W/R/G, B/W/R, G/B/W, R/G/B, or W/R/G/B which can express white through color mixture of white (W), red (R), green (G), and blue (B) subpixels P.

Referring to FIG. 2, each pixel P includes an OLED element connected between a high-potential power voltage (hereinafter, EVDD) line and a low-potential power voltage (hereinafter, EVSS) line, and first and second switching TFTs ST1 and ST2, a driving TFT DT, and a capacitor C, for independently driving the OLED element. Since the pixel may be variously configured, the pixel is not limited to the configuration illustrated in FIG. 2. Amorphous silicon (a-Si) TFTs, polycrystalline silicon (poly-Si) TFTs, oxide TFTs, or organic TFTs may be used as the switching TFTs ST1 and ST2 and the driving TFT DT.

The OLED element includes an anode connected to a source electrode of the driving TFT DT, a cathode connected to the EVSS line, and an organic light-emitting layer connected between the anode and the cathode. Although the anode is independently formed with respect to each pixel, the cathode may be commonly shared by pixels. If a driving current is supplied to the OLED element, electrons and holes are respectively injected from the cathode and the anode into the organic light-emitting layer and recombine in the organic light-emitting layer to emit light of fluorescent or phosphorescent materials, which is proportional to a current value of the driving current.

The first switching TFT ST1 is driven by a scan signal SCAN1 of a first gate line Gn1 of an n-th pixel row to supply a data voltage of a corresponding data line Dm (hereinafter, Vdata) to a gate node of the driving TFT DT and the second switching TFT ST2 is driven by a scan signal SCAN2 of a second gate line Gn2 to supply a reference voltage of a reference line Rm (hereinafter, Vref) to the source node of the driving TFT DT. The second switching TFT ST2 may be further used as a path for outputting current supplied from the driving TFT DT to the reference line Rm in a sensing mode. The first and second gate lines Gn1 and Gn2 may be integrated into one gate line Gn. That is, the first and second switching TFTs ST1 and ST2 may be controlled by the same scan signal supplied from one gate line Gn of the n-th pixel row during a scan period.

The capacitor C is connected between the gate node and source node of the driving TFT DT. The capacitor C is charged with a driving voltage representing a difference Vdata−Vref between Vdata supplied to the gate node of the driving TFT DT through the first switching TFT ST1 and Vref supplied to the source node of the driving TFT DT through the second switching TFT ST2. The driving voltage (hereinafter, Vgs) drives the driving TFT DT during the scan period. During a light-emitting period during which the first and second switching TFTs are turned off, the capacitor C holds Vgs so as to cause the driving TFT DT to continue to supply a driving current determined by Vgs to the OLED element.

The driving TFT DT controls current supplied from the EVDD line PL according to Vgs supplied from the capacitor C to supply the driving current proportional to Vgs to the OLED, thereby causing the OLED element to emit light.

The power source 50 generates various driving voltages, e.g., EVDD and EVSS, needed to drive the timing controller 40, the gate driver 20, the data driver 30, and the display panel 10, using an input voltage. For example, the power source 50 may generate and supply EVDD and EVSS supplied to the display panel through the data driver 30, driving voltages VDD and GND used in the data driver 30 and the timing controller 40, and a gate-on voltage (a gate high voltage) and a gate-off voltage (a gate low voltage) used in the gate driver 20.

The gate driver 20 is controlled by the timing controller 40 and drives a plurality of gate lines of the display panel 10. The gate driver 20 supplies a scan pulse of a gate-on voltage during a scan period and a gate-off voltage during the other periods, to each gate line in response to a gate control signal supplied from the timing controller 40.

The data driver 30 receives a data control signal and image data from the timing controller 40. The data driver 30 is driven according to the data control signal, segments a reference gamma voltage set supplied from a gamma voltage generator into gray-level voltages corresponding to gray-level values of data, converts digital image data into an analog data voltage using the segmented gray-level voltages, and then supplies the analog data signal to data lines of the display panel.

The data driver 30 receives EVDD and EVSS from the power source 50 and supplies EVDD and EVSS to the EVDD line PL and the EVSS line of the display panel 10, respectively. In addition, the data driver 30 receives a variable Vref from a Vref adjuster 60 and supplies the variable Vref to reference lines R1 to Rm of the display panel 10.

In addition, the data driver 30 may supply a sensing voltage to data lines D1 to Dm according to control of the timing controller 40 in a desired sensing mode, sense, through the reference lines R1 to Rm, a pixel current which is driven by the supplied sensing voltage and in which driving characteristics (a threshold voltage of the driving TFT, mobility, etc.) of each pixel is reflected, convert the pixel current into sensing information of each pixel P, and supply the sensing information to the timing controller 40.

The timing controller 40 generates a data control signal for controlling a driving timing of the data driver 30 and a gate control signal for controlling a driving timing of the gate driver 20, using basic timing control signals supplied from an external system, and outputs the data control signal and the gate control signal to the data driver 30 and the gate driver 20, respectively. The timing control signals include a dot clock, a data enable signal, a vertical synchronization signal, and a horizontal synchronization signal.

The timing controller 40 performs a variety of forms of image processing for picture quality compensation, degradation compensation, power consumption reduction, etc. with respect to image data supplied from the external system and outputs the image-processed data to the data driver 30.

For example, the timing controller 40 may compensate for the image data by reflecting the sensing information of each pixel P sensed through the data driver 30 in a sensing mode and then applying a compensation value of each pixel P stored in a memory. The timing controller 40 may predict a degradation degree of the display panel 10 using a result of accumulating the image data, reflect the predicted degradation degree to adjust a luminance gain, and then compensate for the image data by applying the luminance gain. The timing controller 40 calculates an average picture level (hereinafter, APL) through image analysis on a frame basis and adjusts the luminance gain using the APL to thus compensate for the image data so as to reduce power consumption. In addition, the timing controller 40 may further compensate for the image data so as to further reduce power consumption by calculating a total current prediction value through image analysis on a frame basis, calculating an automatic current limit (hereinafter, ACL) for limiting current so that the total current prediction value does not exceed a predetermined reference value, and adjusting the luminance gain using the ACL. The timing controller 40 may calculate the total current prediction value on a frame basis by calculating a current value corresponding to each image datum using a current value per gray level (per luminance) prestored on a color channel basis in a lookup table (LUT) form in correspondence to the image data and adding calculated current values.

To compensate for a voltage drop (hereinafter, IR drop) of the EVDD caused by wiring resistance and current of the EVDD line PL in the display panel 10, the Vref adjuster generates and supplies Vref, a voltage level of which varies frame-by-frame, so that the voltage level of Vref applied to the pixel P varies at different distances from the data driver 30 or other source of Vref according to the vertical location of pixel rows #1 to #N. The variable Vref supplied from the Vref adjuster 60 is supplied to reference lines R1 to Rm of the display panel 10 through the data driver 30.

With increasing distance between a pixel and the data driver 30 for supplying the EVDD in the display panel 10, i.e., an EVDD inlet, the IR drop increases and thus the EVDD decreases. If the EVDD supplied to the drain electrode of the driving TFT DT during a scan period of each pixel P decreases, a drain-source voltage Vds of the driving TFT DT decreases and a drain-source current Ids also decreases. To compensate for the IR drop of the EVDD, the Vref adjuster 60 may vary Vref such that Vref is gradually reduced with increasing distance between the pixel and the EVDD inlet, i.e., as the EVDD decreases by the IR drop. As such, even when the same data voltage Vdata is supplied, since the driving voltage charged in the capacitor C, i.e., the gate-source voltage Vgs of the driving TFT DT, increases due to decrease of Vref, luminance deviation between pixels having different vertical locations can be prevented by compensating for the IR drop of the EVDD. In addition, while the driving TFT DT is linearly driven, the IR drop of the EVDD can be compensated for by variation of Vref.

An EVDD sensing unit 70 senses the EVDD fed back through the data driver 30 from the display panel 10 and supplies, to the timing controller 40, an EVDD sensing value through which the amount of voltage drop (the amount of IR drop) can be identified.

The timing controller 40 may control a degree of a Vref voltage level varied by the Vref adjuster 60, using the total current prediction value obtained by a result of image analysis. Alternatively, the timing controller 40 may control the degree of the Vref voltage level varied by the Vref adjuster 60, using the EVDD sensing value sensed through the EVDD sensing unit 70. In other words, the timing controller 40 may generate a control signal using at least one of the total current predication value obtained as a result of image analysis and the EVDD sensing value supplied from the EVDD sensing unit 70 and control a maximum Vref value, a minimum Vref value, and a Vref slope of the Vref adjuster 60 using the control signal, thereby controlling the varied degree of the Vref voltage level. For example, the timing controller may control the Vref adjuster 60 to vary between the minimum value and the maximum value according to the determined slope.

In FIG. 1, the Vref adjuster 60 and the EVDD sensing unit 70 may be integrated into the power source 50, the data driver 30, or the timing controller 40. Alternatively, the Vref adjuster 60 may be integrated into the power source 50 and the EVDD sensing unit 70 may be integrated into the data driver 30.

Figure 3:
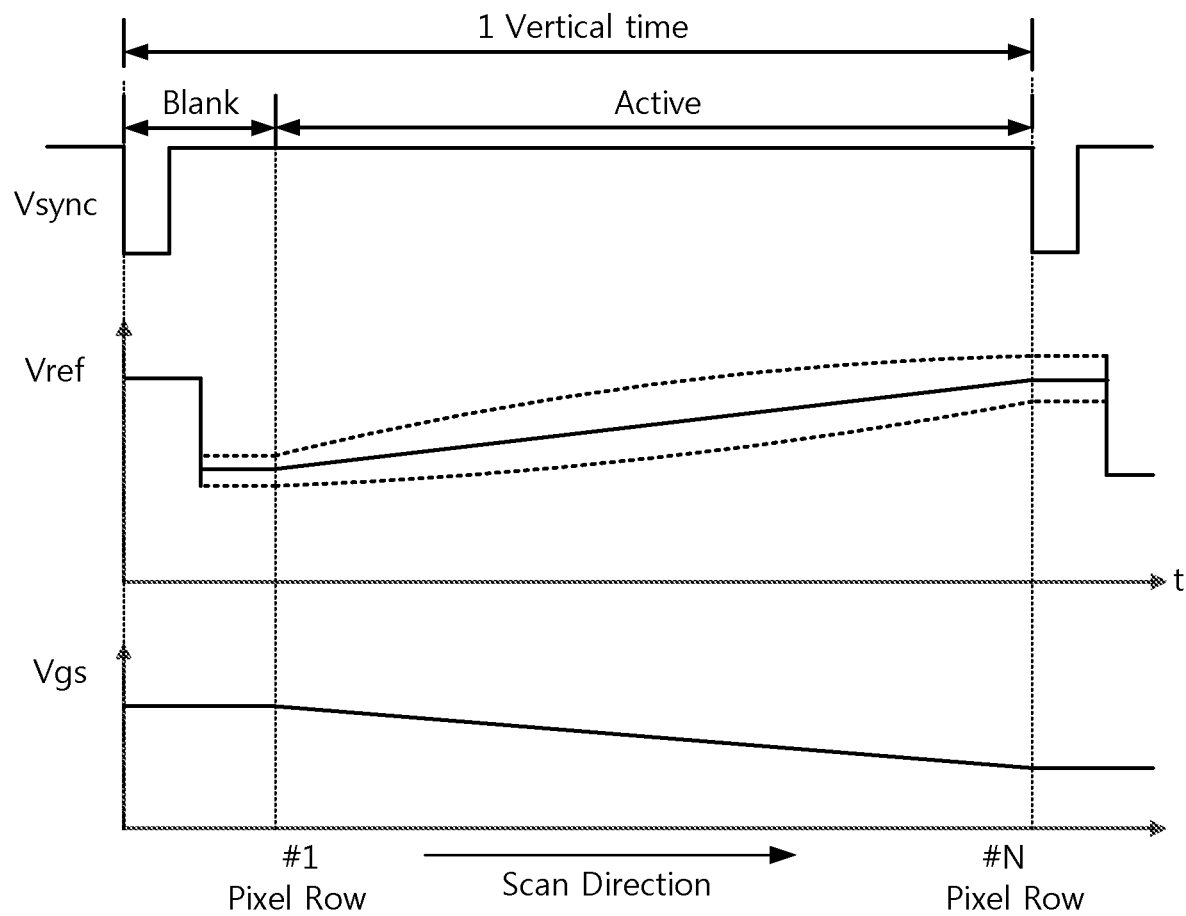
FIG. 3 is a diagram illustrating variable characteristics of a reference voltage Vref and a driving voltage Vgs during a time of one frame according to an embodiment of the present invention.

Referring to FIGS. 1 and 3, during an active period of each vertical period determined by a vertical synchronization signal Vsync, the display panel 10 is sequentially scanned from the first pixel row #1, which is farthest from the EVDD inlet, to the N-th pixel row # N, which is nearest to the EVDD inlet. The EVDD applied to the first pixel row #1, which is farthest from the EVDD inlet, becomes lowest because the largest amount of IR drop occurs and the EVDD applied to the N pixel row # N, which is nearest to the EVDD inlet, becomes highest because the smallest amount of the IR drop occurs. In other words, the EVDD applied to pixel rows starting from the first pixel row, which is farthest from the EVDD inlet, to the N-th pixel row # N, which is nearest to the EVDD inlet, gradually increases.

During this active period, as time elapses while pixel rows starting from the first pixel row, which is farthest from the EVDD inlet, to the N-th pixel row # N, which is nearest to the EVDD inlet, are scanned, Vref applied to the display panel 10 gradually increases. Therefore, the driving voltage Vgs of each pixel P sequentially charged in the first pixel row #1 to the N-th pixel row # N gradually decreases and thus the IR drop of the EVDD can be compensated for.

During the active duration, the varied degree of the Vref voltage level may be adjusted according to control of the timing controller 40 using at least one of the total current estimation value according to image characteristics and the EVDD sensing value capable of recognizing the voltage drop degree of the EVDD. That is, the Vref adjuster 60 determines the maximum Vref value, the minimum Vref value, and the Vref slope according to control of the timing controller 40 and generate and supplies, to the display panel 10, Vref, the voltage level of which varies, according to the determined result.

Figure 4:
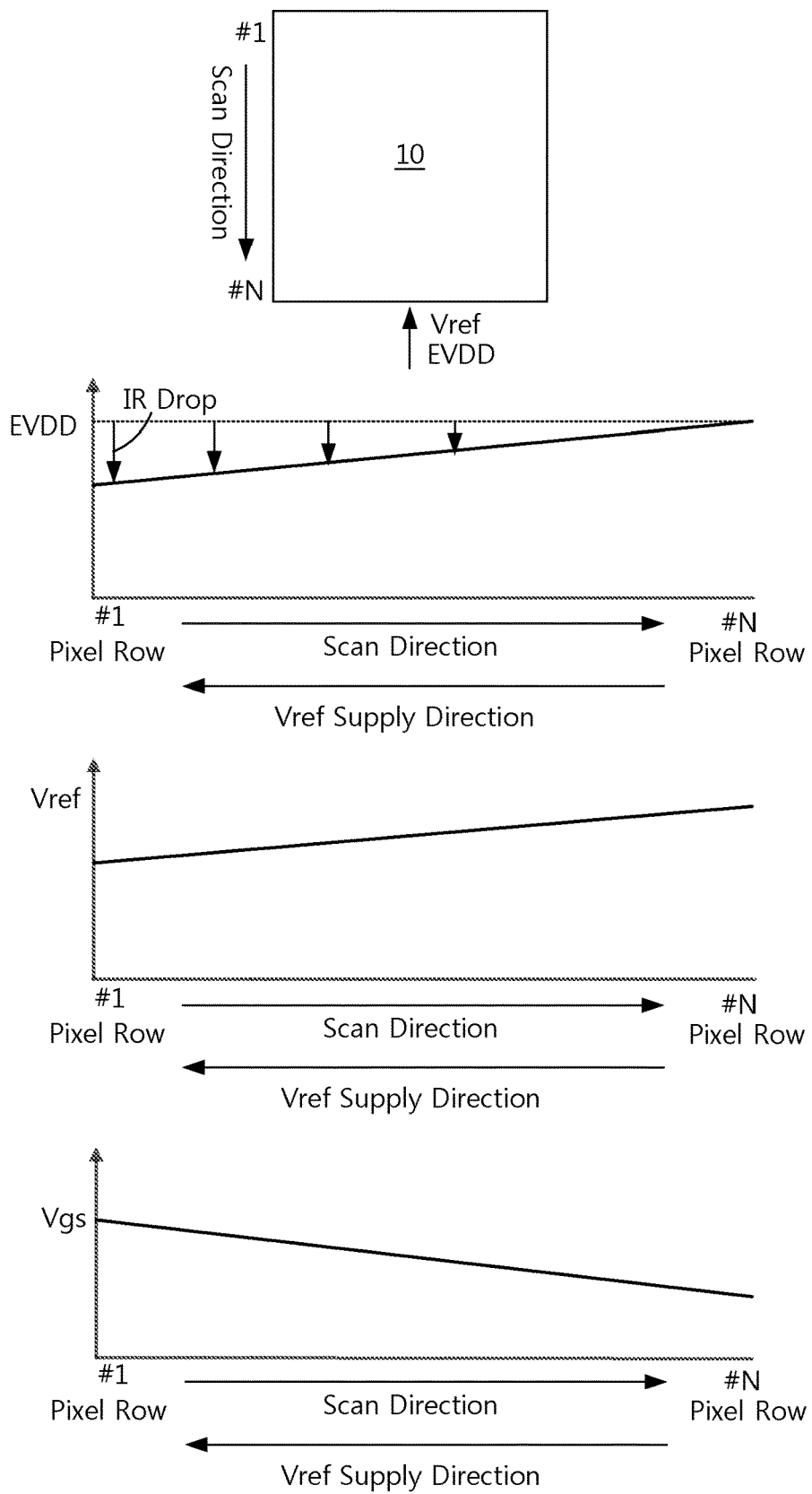
FIG. 4 is a waveform chart illustrating variation characteristics of EVDD, Vref, and Vgs when a scan direction is opposite to an EVDD supply direction in a display panel according to an embodiment of the present invention.

Referring to FIG. 4, if pixel rows are sequentially scanned in the display panel 10 starting from the first pixel row #1, which is farthest from the EVDD inlet, to the N-th pixel row # N, which is nearest to the EVDD inlet, i.e., if EVDD and Vref supply directions and a scan direction are opposite in the display panel 10, the IR drop decreases in the scan direction of pixel rows, EVDD gradually increases, and the variable Vref is supplied in a gradually increasing form. Accordingly, since the driving voltage Vgs charged in the pixel P of the first pixel row #1 to the N-th pixel row # N gradually decreases, the IR drop of the EVDD can be compensated for.

Figure 5:
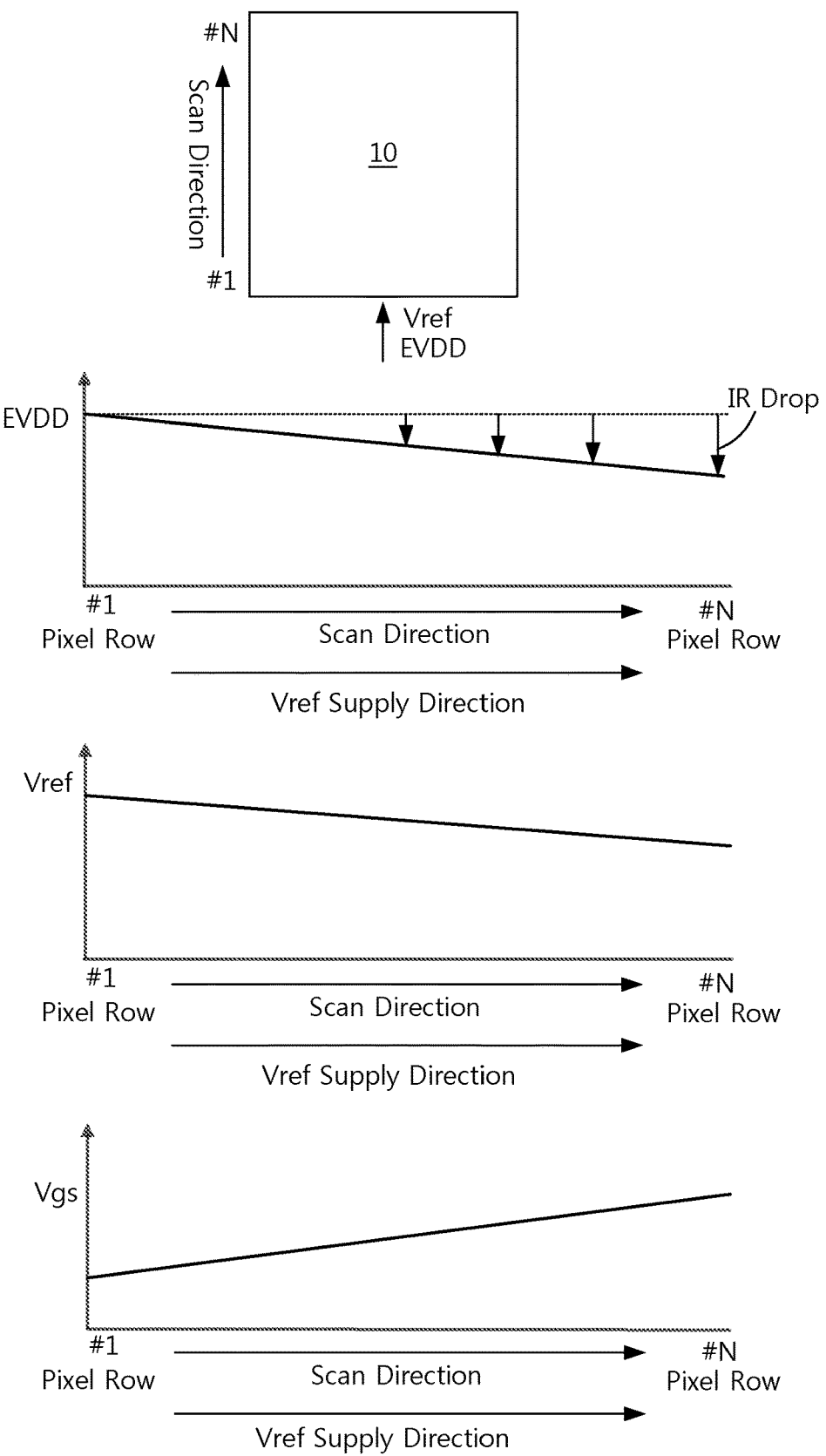
FIG. 5 is a waveform chart illustrating variation characteristics of EVDD, Vref, and Vgs when a scan direction is equal to an EVDD supply direction in a display panel according to an embodiment of the present invention.

Conversely, as illustrated in FIG. 5, if pixel rows are sequentially scanned in the display panel 10 starting from the first pixel row #1, which is nearest to the EVDD inlet, to the N-th pixel row # N, which is farthest from the EVDD inlet, i.e., if the EVDD and Vref supply directions and the scan direction in the display panel 10 are the same, the IR drop increases in the scan direction of pixel rows, EVDD gradually decreases, and the variable Vref is supplied in a gradually decreasing form. Accordingly, since the driving voltage Vgs charged in the pixel P of the first pixel row #1 to the N-th pixel row # N gradually increases, the IR drop of the EVDD can be compensated for.

Figure 6:
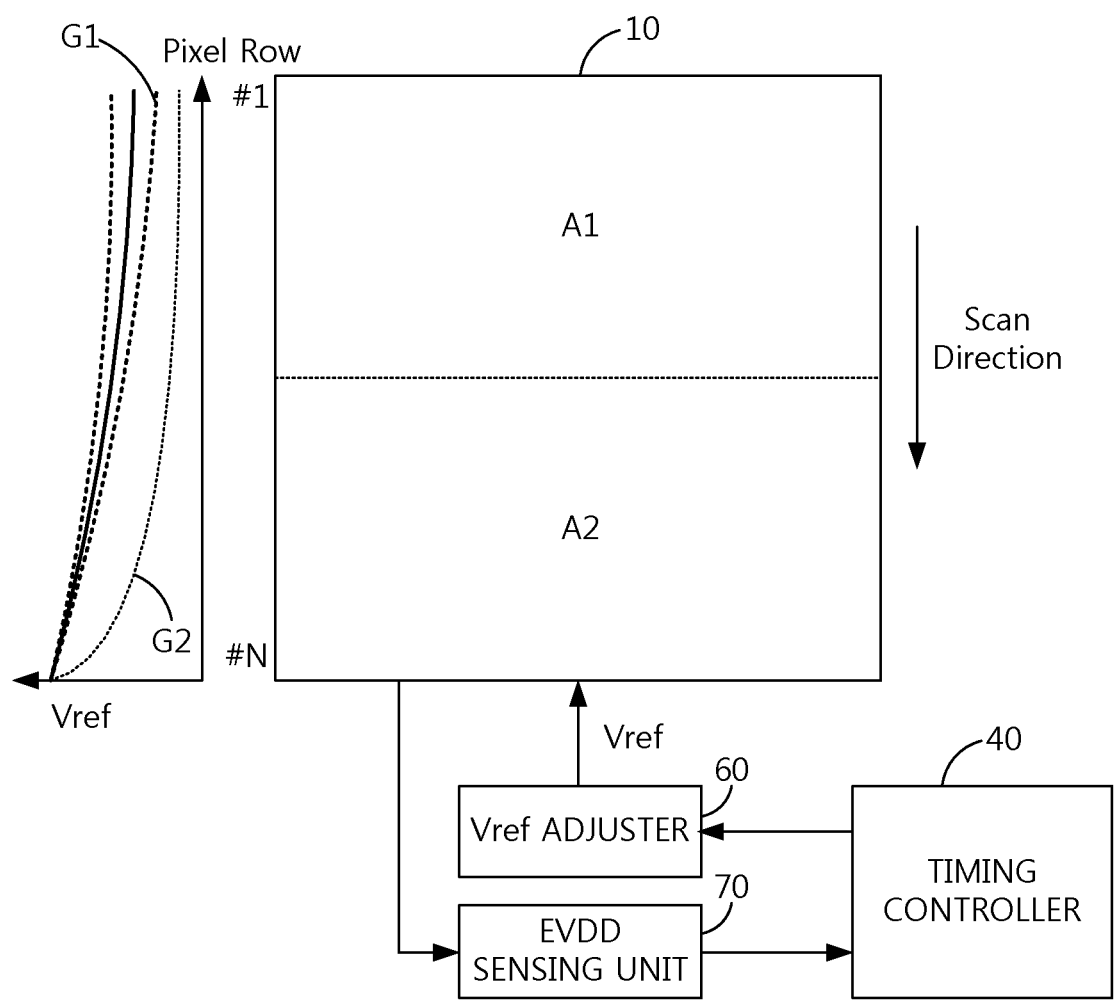
FIG. 6 is a block diagram of an OLED display device according to an embodiment of the present invention.
Figure 7:
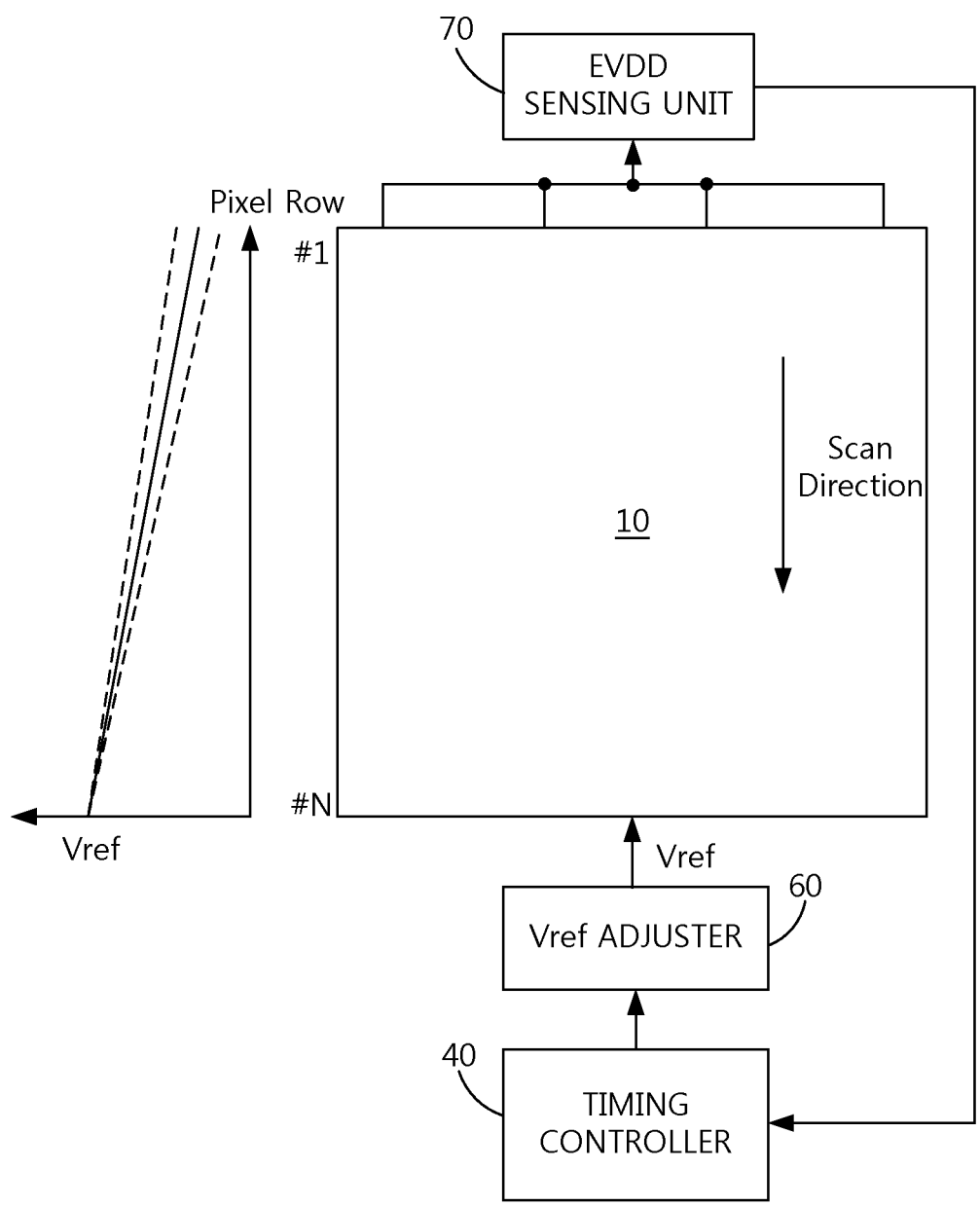
FIG. 7 is a block diagram of an OLED display device according to an embodiment of the present invention.
Figure 8:
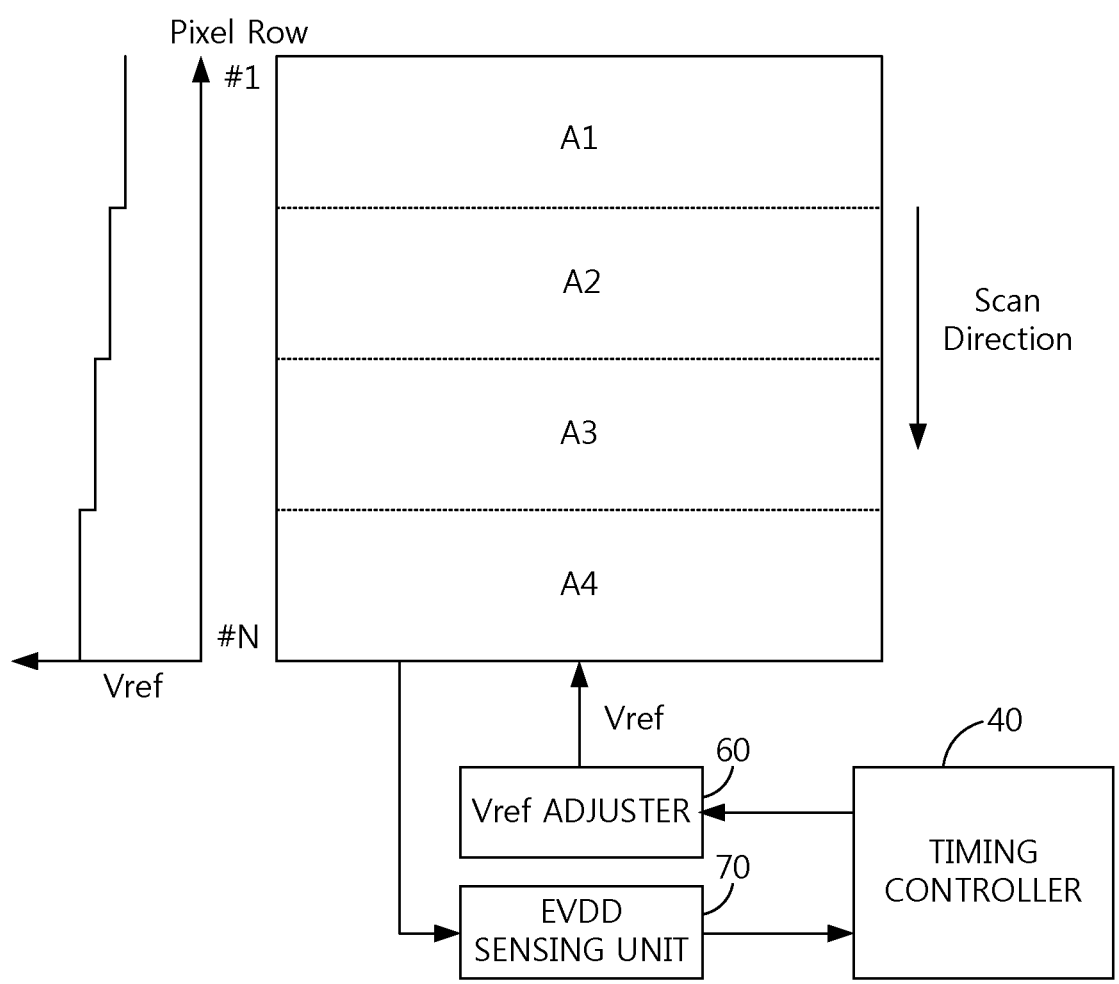
FIG. 8 is a block diagram of an OLED display device according to an embodiment of the present invention.

FIGS. 6 to 8 are diagrams mainly illustrating a configuration related to Vref variation in an OLED display device according to an embodiment of the present invention.

Referring to FIG. 6, the timing controller 40 may determine the maximum Vref value, the minimum Vref value, and the Vref slope, using the total current prediction value obtained through image analysis and the EVDD sensing value of the display panel 10 obtained through the EVDD sensing unit 70, and control the Vref adjuster 60. Then, the Vref adjuster 60 generates Vref, the voltage level of which varies according to the maximum Vref value, the minimum Vref value, and the Vref slope determined by control of the timing controller 40, and supplies Vref to the display panel 10. In this case, the variable slope of Vref may be curve as illustrated in FIG. 6.

For example, if an image has a large total current estimation value or a small EVDD sensing value, since the amount of IR drop of the EVDD increases with increasing distance between a pixel and the EVDD inlet, the minimum Vref value applied to the pixel row #1 farthest from the EVDD inlet is determined to be a relatively small value as in a first graph G1 in order to compensate for the increased IR drop and the variable slope of Vref having a gradually increasing voltage level may relatively increase while pixel rows are sequentially scanned from the pixel row #1 farthest from the EVDD inlet to the pixel row # N nearest to the EVDD inlet.

Meanwhile, in FIG. 6, if a current prediction value of an image displayed in a first region A1 which is distant from the EVDD inlet is greater than a current prediction value of an image displayed in a second region A2, the amount of current dissipated in the first region A1 increases and thus the amount of IR drop of the EVDD increases. Therefore, the variable slope of Vref sharply varies as in a second graph G2.

Referring to FIG. 7, the timing controller 40 may control the Vref adjuster 60 by determining the maximum Vref value, the minimum Vref value, and the Vref slope using the EVDD sensing value of the display panel obtained on a real-time basis through the EVDD sensing unit 70. Then, the Vref adjuster 60 generates Vref, the voltage level of which varies according to the maximum Vref value, the minimum Vref value, and Vref slope determined according to control of the timing controller 40, and supplies the Vref to the display panel 10. In this case, the variable slope of Vref may be a linear type as illustrated in FIG. 7.

Referring to FIG. 8, the timing controller 40 may control the Vref adjuster 60 by determining the maximum Vref value, the minimum Vref value, and the Vref slope using the total current prediction value obtained through image analysis and the EVDD sensing value obtained from the EVDD sensing unit 70. Then, the Vref adjuster 60 may generate Vref, the voltage level of which varies in a step form in regions A1, A2, A3, and A4 of the display panel 10 and supply Vref to the display panel 10. The minimum Vref value is applied to the region A1 which is farthest from the EVDD inlet, the maximum Vref value is applied to the region A4 which is nearest to the EVDD inlet, and Vref which increases stepwise in each region from the minimum Vref value to the maximum Vref value may be applied to the regions A2 and A3 between the regions A1 and A4.

As described above, the OLED display device according to an embodiment reduces a reference voltage with increasing distance between a pixel and an EVDD inlet, thereby increasing a driving voltage Vgs of a driving TFT charged in a pixel with respect to the same data voltage during a scan period. Therefore, an IR drop of an EVDD which increases with increasing distance between a pixel and the EVDD inlet can be compensated for and thus luminance deviation of the IR drop of the EVDD can be prevented. Then, since a wiring width of an EVDD power line can be reduced in a display panel, power consumption can be reduced and a light-emitting area of an OLED element increases due to the reduced wiring width, thereby increasing lifespan of the display panel.

The OLED display device according to an embodiment controls a maximum value, a minimum value, a slope of a reference voltage by reflecting a sensing result of an EVDD from the display panel and a current predication value through analysis of image characteristics. Therefore, dissipated power can be optimized by adaptively adjusting the reference voltage according to image characteristics.

It will be apparent to those skilled in the art that various modifications and variations can be made in the present invention without departing from the spirit or scope of the invention. Thus, the present invention is intended to cover the modifications and variations of this invention within the scope of the appended claims and their equivalents.

What is claimed is:

1. An organic light-emitting diode (OLED) display device, comprising:
a display panel including pixels configured to charge a capacitor with a driving voltage representing a difference between a data voltage supplied to a driving thin-film transistor (TFT) from a data line and a reference voltage supplied to the driving TFT from a reference line to cause an OLED element to emit light;
a power line configured to supply a high-potential power voltage to a driving TFT of each of the pixels;
a data driver configured to supply the data voltage, the reference voltage, and the high-potential power voltage to the display panel; and
a reference voltage adjuster configured to generate the reference voltage to have a voltage level that gradually decreases as the reference voltage is supplied to driving TFTs of pixels at greater distances from the data driver supplying the high-potential power voltage, the reference voltage adjuster to supply the reference voltage to the data driver for supplying to the display panel,
wherein the data driver supplies the data voltage and the reference voltage on a same side of the display panel.

2. The OLED display device according to claim 1, further comprising:
a timing controller configured to analyze an input image to calculate a total current predication value, and
a sensing unit configured to sense the high-potential power voltage fed back through the data driver from the display panel to generate a sensing value,
wherein the timing controller controls the reference voltage adjuster to vary the voltage level of the reference voltage based on at least one of the total current predication value and the sensing value of the high-potential power voltage.

3. The OLED display device according to claim 2, wherein the timing controller controls the reference voltage adjuster to generate the reference voltage to vary between a minimum value and a maximum value according to a slope of the reference voltage.

4. The OLED display device according to claim 3, wherein the timing controller controls the reference voltage adjuster to decrease the minimum value of the reference voltage and increase the slope of the reference voltage, as the total current prediction value of the image increases.

5. The OLED display device according to claim 3, wherein the timing controller controls the reference voltage adjuster to decrease the minimum value of the reference voltage and increase the slope of the reference voltage as the sensing value of the high-potential power voltage decreases.

6. The OLED display device according to claim 1, wherein the timing controller controls the reference voltage adjuster to decrease the reference voltage when driving pixels with increasing distance to the data driver.

7. The OLED display device according to claim 1, wherein the timing controller controls the reference voltage adjuster to decrease the reference voltage when driving pixels with decreased high-power power voltage.

8. The OLED display device according to claim 1, wherein the timing controller controls the reference voltage adjuster to increase the reference voltage over a frame period as pixel rows are sequentially scanned starting from a pixel row farthest from the data driver to a pixel row nearest to the data driver in the display panel.

9. The OLED display device according to claim 1, wherein the timing controller controls the reference voltage adjuster to decrease the reference voltage over a frame period as pixel rows are sequentially scanned starting from a pixel row nearest to the data driver to a pixel row farthest from the data driver in the display panel.

10. The OLED display device according to claim 1, wherein the display panel is segmented into a plurality of regions in a scan direction and wherein the timing controller controls the reference voltage adjuster to adjust the reference voltage stepwise in between scanning each of the plurality of regions.

11. An organic light-emitting diode (OLED) display device comprising:
a display panel comprising a plurality of pixels arranged in pixel rows, a plurality of data lines to provide respective data voltages to the plurality of pixel rows, a plurality of reference lines to provide respective reference voltages to the plurality of pixel rows, and a power line to distribute a high-potential power voltage to power each of the plurality of pixels, the plurality of pixels to cause respective OLED elements to emit light based on differences between the respective data voltages and the respective reference voltages;
a high-potential power source configured to provide the high-potential power voltage to the power line; and
a reference voltage adjuster configured to generate the respective reference voltages for each of the plurality of pixel rows, wherein the reference voltage adjuster generates the respective reference voltages for the plurality of pixel rows to vary between a minimum reference voltage applied to a reference line of a pixel row farthest from the high-potential power source and a maximum reference voltage applied to a reference line for a pixel row closest to the high-potential power source.

12. The OLED display device of claim 11, wherein the reference voltage adjuster generates the respective reference voltages for the plurality of pixel rows to increase with decreasing distance from the high-potential power source.

13. The OLED display device of claim 11, wherein the reference voltage adjuster generates the respective reference voltages for the plurality of pixel rows to vary non-linearly between a minimum reference voltage applied to a reference line of a pixel row farthest from the high-potential power source and a maximum reference voltage applied to a reference line for a pixel row closest to the high-potential power source.

14. The OLED display device of claim 11, wherein the reference voltage adjuster generates the respective reference voltages for the plurality of pixel rows to vary linearly between a minimum reference voltage applied to a reference line of a pixel row farthest from the high-potential power source and a maximum reference voltage applied to a reference line for a pixel row closest to the high-potential power source.

15. The OLED display device of claim 11, wherein the reference voltage adjuster generates the respective reference voltages for the plurality of pixel rows to vary step-wise in different sub-sections of the display panel between a minimum reference voltage applied to a reference line of a pixel row farthest from the high-potential power source and a maximum reference voltage applied to a reference line for a pixel row closest to the high-potential power source.

16. The OLED display device of claim 11, wherein for a given pixel row, the reference voltage adjuster generates a corresponding reference voltage based on a sensed voltage sensing the high potential power voltage while driving the given pixel row.

17. The OLED display device of claim 11, wherein for a given pixel row, the reference voltage adjuster generates a corresponding reference voltage based on a predicted total current dissipated when driving the given pixel row.

18. A method for operating an organic light-emitting diode (OLED) display device, the method comprising:
a display panel comprising a plurality of pixels arranged in pixel rows, a plurality of data lines to provide respective data voltages to the plurality of pixel rows, a plurality of reference lines to provide respective reference voltages to the plurality of pixel rows, and a power line to distribute a high-potential power voltage to power each of the plurality of pixels, the plurality of pixels to cause respective OLED elements to emit light based on differences between the respective data voltages and the respective reference voltages;
a high-potential power source to provide the high-potential power voltage to the power line;
a data driver configured to supply the data voltage, the reference voltage, and the high-potential power voltage to the display panel; and
a reference voltage adjuster configured to generate the respective reference voltages for each of the plurality of pixel rows, wherein the respective reference voltages for the pixel rows gradually decrease with greater distances from the high-potential power source supplying the high-potential power voltage,
wherein the data driver supplies the data voltage and the reference voltage on a same side of the display panel.

19. The method for operating the OLED display device of claim 18, wherein the reference voltage adjuster generates the respective reference voltages for the plurality of pixel rows to increase with decreasing distance from the high-potential power source.

20. The method for operating the OLED display device of claim 18, wherein the reference voltage adjuster generates the respective reference voltages for the plurality of pixel rows to vary non-linearly between a minimum reference voltage applied to a reference line of a pixel row farthest from the high-potential power source and a maximum reference voltage applied to a reference line for a pixel row closest to the high-potential power source.

* * * * *